(12) United States Patent
Ebata et al.

(10) Patent No.: US 7,190,241 B2
(45) Date of Patent: Mar. 13, 2007

(54) ELASTIC WAVE APPARATUS

(75) Inventors: Yasuo Ebata, Yokohama (JP); Osamu Kawachi, Yokohama (JP)

(73) Assignee: Fujitsu Media Devices Limited, Yokohama (JP)

(*) Notice: Subject to any disclaimer, the term of this patent is extended or adjusted under 35 U.S.C. 154(b) by 111 days.

(21) Appl. No.: 11/138,422

(22) Filed: May 27, 2005

(65) Prior Publication Data

US 2005/0270124 A1    Dec. 8, 2005

(30) Foreign Application Priority Data

Jun. 2, 2004    (JP)    ............................. 2004-164100
May 11, 2005   (JP)    ............................. 2005-138836

(51) Int. Cl.
*H03H 9/64*    (2006.01)
*H03H 9/54*    (2006.01)

(52) U.S. Cl. ...................... 333/193; 333/187; 333/189

(58) Field of Classification Search ................ 333/193, 333/187, 189

See application file for complete search history.

(56) References Cited

U.S. PATENT DOCUMENTS 4,307,356 A * 12/1981 Arai ........................... 333/194
4,438,417 A * 3/1984 Yamashita et al. .......... 333/193
5,619,175 A * 4/1997 Bauregger ................... 333/195
2004/0021191 A1   2/2004 Bradley
2004/0087286 A1   5/2004 Inoue et al.

FOREIGN PATENT DOCUMENTS

| DE | 196 31 745 C1 | 10/1997 |
|----|---------------|---------|
| JP | 03029407      | 2/1991  |
| JP | 5-299210      | 11/1993 |
| JP | 8-167826      | 6/1996  |
| JP | 11-274886     | 10/1999 |
| JP | 2001-168672   | 6/2001  |

* cited by examiner

*Primary Examiner*—Barbara Summons
(74) *Attorney, Agent, or Firm*—Arent Fox PLLC

(57) ABSTRACT

A surface acoustic wave apparatus is configured to avoid destruction from static electricity. The surface acoustic wave apparatus includes a piezoelectric substrate; a surface acoustic wave element having at least one interdigital electrode made up of a conductive film on the piezoelectric substrate; and a thin film electrically connected between terminals connecting to electrode fingers of the interdigital electrode, the thin film showing varistor characteristics formed on the piezoelectric substrate.

13 Claims, 5 Drawing Sheets

ELASTIC WAVE APPARATUS

BACKGROUND OF THE INVENTION

1. Field of the Invention

The present invention relates generally to a surface acoustic wave apparatus using a surface acoustic wave (SAW) element and an elastic wave apparatus using a film bulk acoustic resonator (FBAR), and, more particularly, to a surface acoustic wave apparatus and an elastic wave apparatus incorporated into a mobile communication device such as a cellular phone and used for a filter and an antenna sharing unit or duplexer utilizing surface acoustic waves (SAW) or a film bulk acoustic resonator (FBAR).

2. Description of the Related Art

Recently, corresponding to the demand for miniaturization of mobile devices, a surface acoustic wave apparatus is incorporated into a cellular phone and the like to act as a filter and an antenna duplexer, because of a miniaturized property thereof.

By the way, generally in cellular phones, static electricity charged in human bodies or objects is applied to internal components through antennas and others. As such an internal component, the surface acoustic wave apparatus has a surface acoustic wave element made up of interdigital (IDT) electrode fingers built up with the thin-film conductor consisting primary of aluminum on a piezoelectric crystal substrate.

Intervals between the interdigital (IDT) electrode fingers are mainly determined by the center frequency of the filter and, in the case of 1 to 2 GHz band filters, an interval between the adjacent electrode fingers are 0.1 to 0.5 μm. Therefore, an electric discharge is generated between the electrode fingers when static electricity greater than 50 to 100 V is applied to electrodes. At this point, a discharge current with a high current density instantaneously flows through the electrode fingers at the discharging portion, melts and cuts the electrode fingers and deteriorates or destroys properties of the filter.

Especially, a surface acoustic wave apparatus used as an antenna-duplexer is located at the position electrically connected immediately to an antenna and tends to be affected by such electrostatic discharges.

However, in the surface acoustic wave filter of the antenna duplexer itself, measures have not been taken for the electrostatic discharges until now, and the surface acoustic wave filter has been protected from the electrostatic discharges by inserting a discrete component between the antenna and the surface acoustic wave filter to pass electric charges due to static electricity to ground.

For example, in IEEE Ultrasonics Symp. pp. 9–12, (1998), Hukushima et al., especially in FIG. 5 and page 11, proposed inserting a n type, LC high-pass matching circuit between the antenna and the surface acoustic wave filter and passing static charges from a hot terminal to ground through inductances connected in parallel to protect the surface acoustic wave filter.

Also, a varistor has been used as a discrete component for taking measures to the electrostatic discharges. The varistor has a nonlinear resistance property exhibiting high resistance at low applied voltage and drastically reducing the resistance when the applied voltage becomes high, and thereby, when high voltages are applied, components can be protected from the electrostatic discharges by passing static charges to ground.

However, since the conventional varistor configured as a discrete component has a large capacity (capacitance) not negligible in comparison with 1 to 2 GHz in order to increase a value of the passing current and therefore has a disadvantage that the property of the surface acoustic wave filter is changed by the varistor connecting in parallel with the surface acoustic wave filter. The varistors are used for protecting components from the electrostatic discharges when relatively low frequencies of 100 MHz or lower are handled.

Further, as prior art for taking measures to the electrostatic discharges in the surface acoustic wave apparatus, propositions have been made for the technology using a thin-film resistive element (see, e.g., Japanese Patent Application Laid-Open Publication No. 1996-167826), the technology using a impedance matching coil (see, e.g., Japanese Patent Application Laid-Open Publication No. 1999-274886) or the technology using a capacitive element (see, e.g., Japanese Patent Application Laid-Open Publication No. 2001-168672).

Although the inventions described in Japanese Patent Application Laid-Open Publication Nos. 1996-167826 and 1999-274886 are configured such that electrostatic currents are passed to ground through a resistor or a coil, respectively, since the resistor or the coil is inserted in parallel with a surface acoustic wave element, the property of the surface acoustic wave filter is inevitably affected as is the above case for using the large-capacity varistor.

Also, the invention described in Japanese Patent Application Laid-Open Publication No.2001-168672 is configured such that leak discharges are easily generated by providing a sharp protrusion on a capacitive electrode. In such a configuration, once leak discharge occurs at the capacitive electrode, the protruding leading edge is melted and cut, and subsequent electrostatic discharges can not be induced.

Since mobile devices such as cellular phones are carried by a hand, it is difficult to block external static electricity. Moreover, even if a method is used for protecting the surface acoustic wave filter and the antenna as a circuit from static electricity with prior art described above, in the process when cellular phones are assembled by cellular phone manufacturers, the surface acoustic wave filters itself before mounted into the cellular phones does not have resistance to the electrostatic discharges.

SUMMARY OF THE INVENTION

It is therefore an object of the present invention to provide a surface acoustic wave apparatus configured to avoid destruction from static electricity when the surface acoustic wave filter and the antenna duplexer are placed alone or incorporated into devices.

In order to achieve the above object, according to a first aspect of the present invention there is provided a surface acoustic wave apparatus comprising a piezoelectric substrate; a surface acoustic wave element having at least one interdigital electrode made up of a conductive film on the piezoelectric substrate; and a thin film electrically connected between terminals connecting to electrode fingers of the interdigital electrode, the thin film showing varistor characteristics formed on the piezoelectric substrate. The thin film showing the varistor characteristics may be formed in the region on the piezoelectric substrate except portions where the interdigital electrode is formed and portions where surface acoustic waves propagate. The thin film showing the varistor characteristics may be made up of semiconductor ceramics such as a zinc oxide or a strontium titanate to which a minute amount of an addition agent is added, the semiconductor ceramics having a crystal grain diameter of 1 µm to 50 µm. The thin film showing the varistor characteristics may have a film thickness of 1 µm to 100 µm. When the varistor thin film is formed on the substrate, the film may be formed at a room temperature by the aerosol deposition method, which accelerates and causes micro powders of the material showing the varistor characteristics to collide against a substrate placed in reduced-pressure atmosphere.

In order to achieve the above object, according to a second aspect of the present invention there is provided a surface acoustic wave apparatus comprising a surface acoustic wave chip wherein a surface acoustic wave element having at least one interdigital electrode made up of a conductive film is formed on a piezoelectric substrate; and a package base substrate having a terminal electrode connected via a bump to a terminal electrode of the surface acoustic wave chip formed on the piezoelectric substrate, wherein on the package base substrate, a thin film showing the varistor characteristics is formed, which is electrically connected between electrode fingers of the interdigital electrode. The thin film showing the varistor characteristics may be formed on a top surface or an under surface of the package base substrate or within the substrate.

In order to achieve the above object, according to a third aspect of the present invention there is provided an elastic wave apparatus comprising a substrate having a cavity region excavated by anisotropic etching in the direction of thickness; a film bulk acoustic resonator disposed at a position corresponding to the cavity region of the substrate; a thin film showing varistor characteristics formed on the substrate, the thin film electrically connected between terminals of the film bulk acoustic resonator.

By virtue of the above configurations according to the present invention, a thin film showing varistor characteristics can protect interdigital electrodes of a surface acoustic wave element by making resistance between a hot terminal and a ground terminal low and passing static charges to ground when a high voltage greater than a varistor voltage is applied.

Also, the thin film showing the varistor characteristics is integrally formed on a piezoelectric substrate onto which the surface acoustic wave element is formed and, therefore, destruction due to electrostatic discharges can be prevented at the time of a process for incorporating a surface acoustic wave apparatus or an elastic wave apparatus into a mobile device or others.

BRIEF DESCRIPTION OF THE DRAWINGS

The above and other objects, aspects, features and advantages of the present invention will become more apparent from the following detailed description when taken in conjunction with the accompanying drawings, in which.

DESCRIPTION OF THE PREFERRED EMBODIMENTS

Embodiments of the present invention will now be described with reference to the accompanying drawings.

Figure 1:
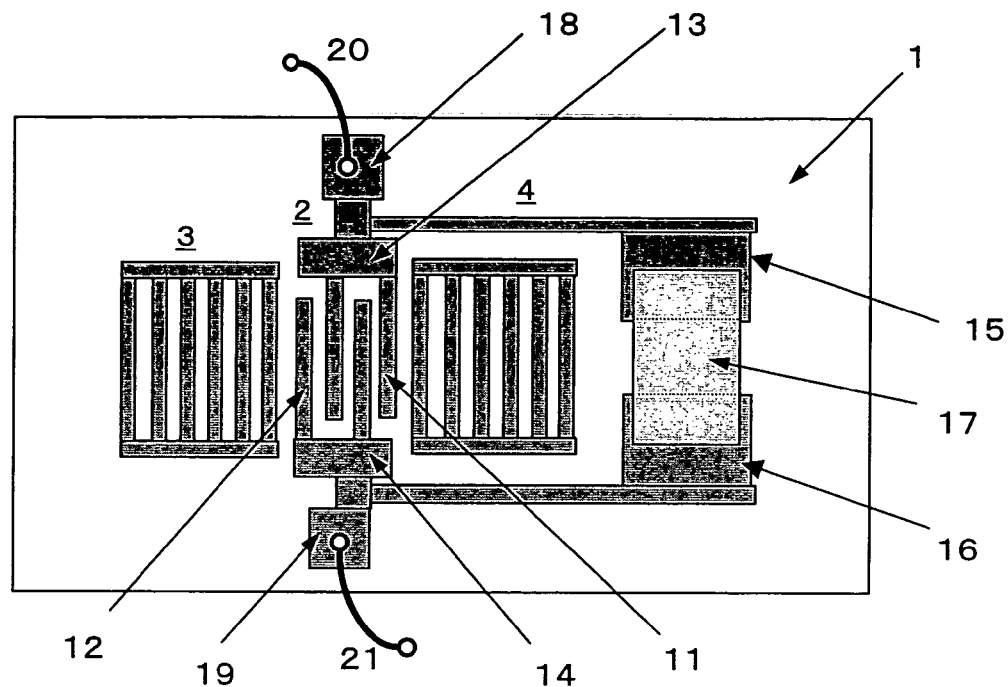
FIG. 1 is a block diagram showing a top view of a first embodiment of a surface acoustic wave apparatus according to the present invention.

FIG. 1 is a block diagram showing a top view of a first embodiment of a surface acoustic wave apparatus according to the present invention. In FIG. 1, a surface acoustic wave (SAW) element is formed on a piezoelectric crystal substrate 1 such as quartz, LiTaO3, or LINbO3. The surface acoustic wave (SAW) element has a resonator, which has opposing interdigital electrodes 11 and 12, and reflectors 3, 4 disposed on both sides of the resonator 2.

Electrodes constituting these resonator 2 and reflectors 3, 4 consist primary of Al and formed on the piezoelectric crystal substrate 1 through the photolithography technology.

A varistor thin film 17 is formed between varistor terminal patterns 15, 16 drawn out from bus bars 13, 14 connected respectively to the opposing interdigital electrodes 11, 12 formed by the photolithography technology. The varistor terminal patterns 15, 16 and the varistor thin film 17 may be disposed upside down.

Figure 2:
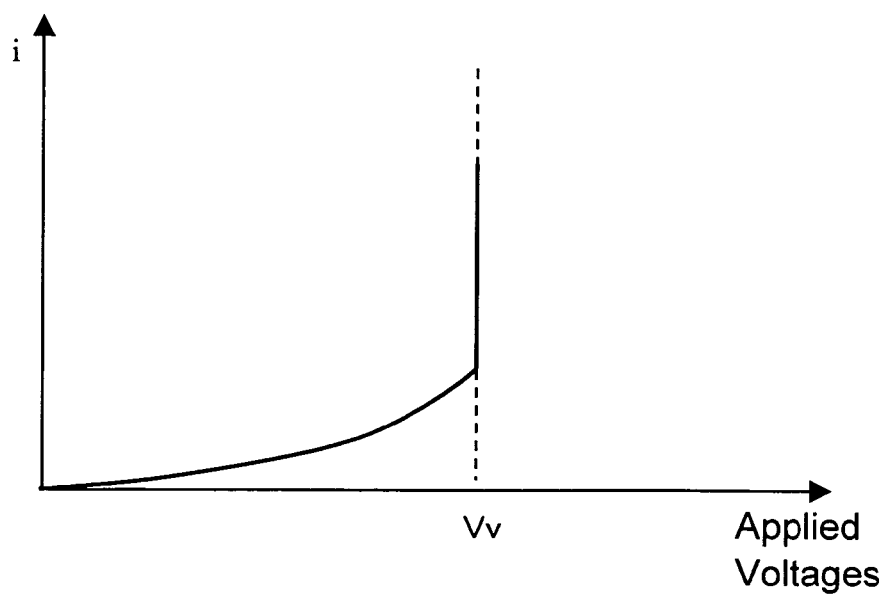
FIG. 2 is a diagram showing varistor characteristics.

The varistor thin film 17 refers to a thin-film object showing a nonlinear resistance property which drastically reduces a value of resistance when an applied voltage exceeds a varistor voltage Vv (and increases a current i), as shown in FIG. 2. The materials include, for example, so-called semiconductor ceramics such as a zinc oxide with the addition of a minute amount of a lanthanum oxide, praseodymium oxide or cobalt oxide as an addition agent, and a strontium titanate.

A poly crystal ceramic thin film is made up of these materials by a sputtering method or sintering method. This ceramic is made up of crystal grains and grain boundaries, and Schottkey barriers are formed in the grain boundary portion. High resistances are exhibited at the Schottkey voltage or lower since electrons can not break through the barriers, however, lower resistances are exhibited at higher voltages since electrons breaks through the barriers and electric currents flow.

Now, a method of fabrication for a thin-film varistor is considered. A proposition has been made for a method of a thin-film varistor at relatively low temperature with hydrothermal processing (see, e.g., Japanese Patent Application Laid-Open Publication No. 1993-299210). In the method, the hydrothermal processing is treated at temperatures higher than 100° C.

As this, generally, after varistor films are formed, the films must be burned at high temperatures or subjected to heat treatments at temperatures higher than 100° C. However, after electrode patterns consisting primary of Al are formed on the piezoelectric substrate, it is not desirable to raise the temperature of the substrate because of deterioration of the electrodes. Therefore, the varistor thin film can be formed relatively lower temperatures such as a room temperature or temperatures lower than 100° C. by use of the aerosol deposition method which forms fine thin films by reducing the burned or thermally treated varistor materials to micro powders and blowing the powders to the substrate placed in reduced-pressure atmosphere.

In FIG. 1, when bonding wires 20, 21 are connected to external package terminals and high voltages due to static electricity is applied externally through terminal pads 18, 19, the highest electric field is applied between electrode fingers of adjacent interdigital electrode 11, 12. At this point, in the case of 1 GHz to 2 GHz surface acoustic wave elements, discharges are created on the order of 50 to 200 V. In this instance, the electrode fingers are melted and cut by discharge currents or heat generation due to the discharges. Consequently, the surface acoustic wave elements can not exert inherent properties, resulting in element destruction.

According to the present invention, the varistor terminal patterns 15, 16 are drawn out in parallel from the opposing interdigital electrodes 11, 12 as shown in FIG. 1 and the varistor thin film 17 is formed in the gap. Therefore, when high voltages are applied due to static electricity, the static charges flow through the varistor thin film 17 and destruction from discharges can be avoided at the interdigital fingers 11, 12.

The varistor voltage can be changed by crystal grain diameters, grain boundaries and gap distances between the varistor terminal patterns 15, 16 and is optimized depending on conditions to be used. In general, if the varistor voltage is at or greater than the voltage creating discharges between the interdigital fingers 11, 12, the protective function of the varistor thin film 17 can not be exerted since discharges between the interdigital fingers 11, 12 are created first. On the other hand, if the varistor voltage is too low, inherent properties of the surface acoustic wave element can not be exerted since the varistor thin film 17 exhibits low resistance even at the signal voltages applied to the surface acoustic wave element.

Therefore, the varistor voltage is desired to be 20 to 100 V for the surface acoustic wave filter in the frequency range of 1 to 2 GHz.

Figure 3:
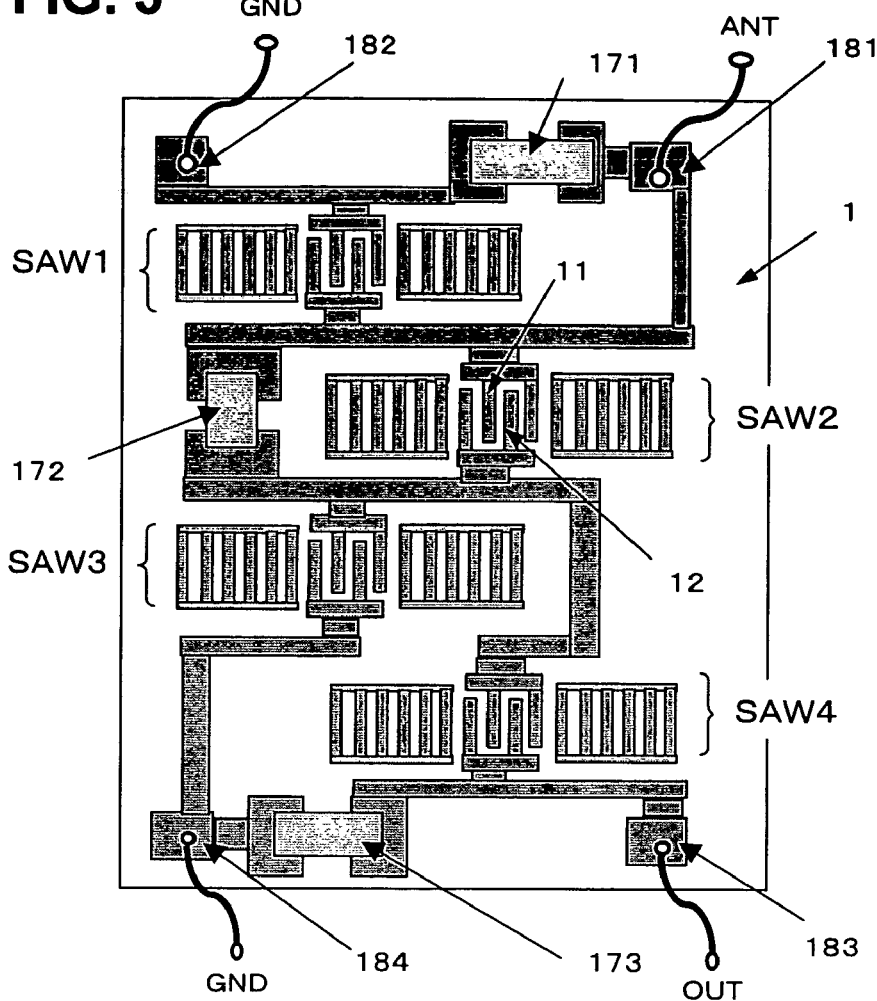
FIG. 3 is a diagram showing an embodiment applying the present invention to a ladder surface acoustic wave filter.
Figure 4:
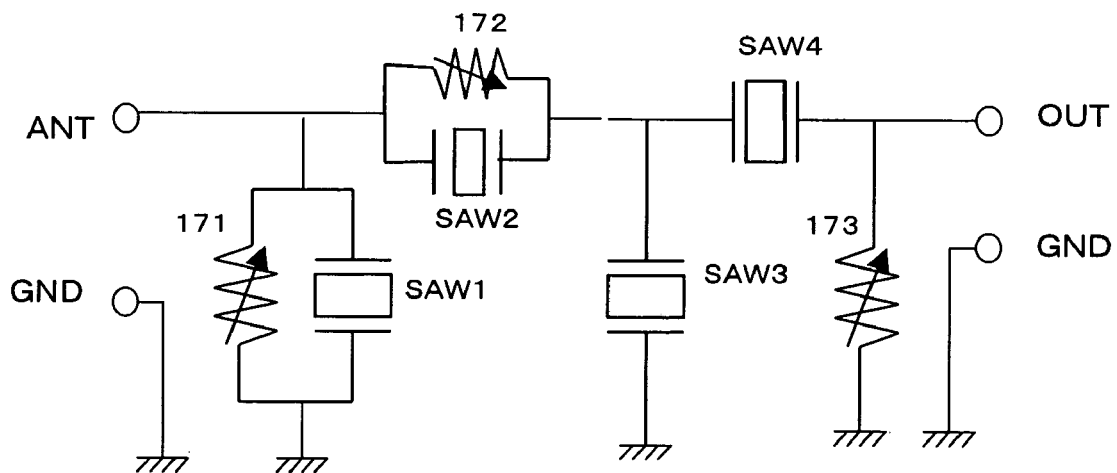
FIG. 4 shows an equivalent circuit for the embodiment of FIG. 3.

FIG. 3 shows an embodiment applying the present invention to a ladder surface acoustic wave filter consisting of a plurality of one-port surface acoustic wave resonators. FIG. 4 is an equivalent circuit of the ladder surface acoustic wave filter of FIG. 3.

A plurality of (four (4)) one-port surface acoustic wave resonators SAW1 to SAW4 are connected by conductive patterns in parallel and serially to make up a band-pass filter on the piezoelectric substrate 1. Terminal pads 181 to 184 on chips in outer edges are connected via bonding wires to package terminals, which are not shown.

Static electricity is transferred from outside via the package and bonding wire to an input terminal pad 181 of the surface acoustic wave apparatus of FIG. 3, and a high voltage is applied between the input terminal pad 181 and an input-side ground terminal pad 182

If this high voltage exceeds the varistor voltage, a static charge flows through a varistor thin film 171 to ground to protect the surface acoustic wave resonator SAW1 from the electrostatic discharges.

Also in this embodiment, in a second-level surface acoustic wave element SAW2, a varistor thin film 172 is connected between interdigital electrode fingers 11, 12. When only the external static electricity is avoided, this varistor thin film 172 is not needed in principle. However, the varistor thin film 172 is useful for protection from destruction of the interdigital electrode fingers due to generated charges within elements, for example, high voltages due to pyroelectric effects generated by the piezoelectric substrate 1.

Figure 5:
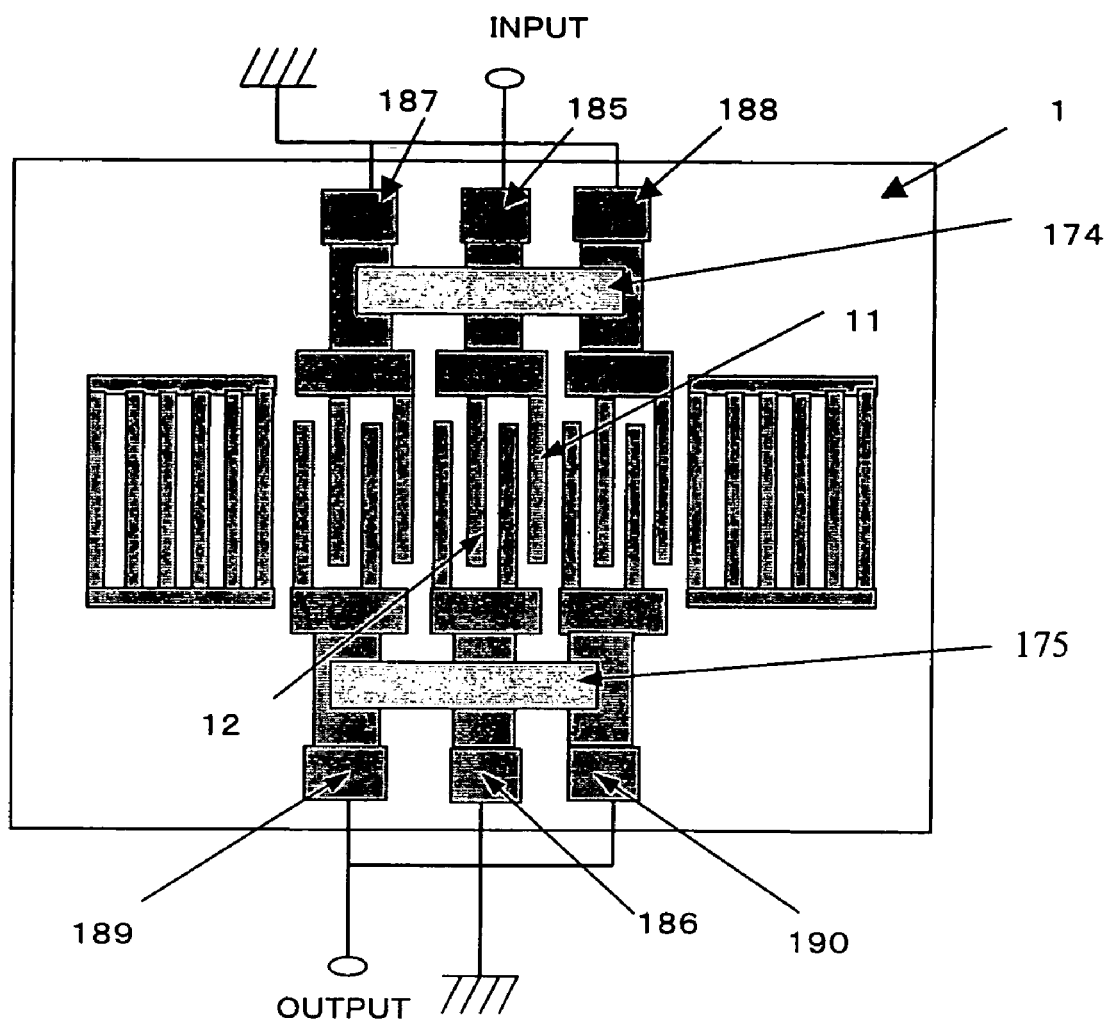
FIG. 5 shows an example of the present invention applied to a longitudinal-mode coupling multimode surface acoustic wave filter provided with three (3) interdigital transducers and grating reflectors on both sides thereof.

FIG. 5 is an example of the present invention applied to a longitudinal-mode coupling multimode surface acoustic wave filter provided with three (3) interdigital transducers and grating reflectors on both sides thereof.

When static electricity is applied to an input terminal pad 185 configured on a piezoelectric crystal substrate 1, the static electricity is transferred to a center interdigital electrode, and difference in potential from an input-side ground pad 186 is applied between adjacent interdigital electrode fingers 11, 12.

In FIG. 5, a pattern of a conductive film is not connected to the input-side ground pad 186 on the surface of the surface acoustic wave chip. In this case, it is assumed that the input-side ground pad 186 is electrically connected with output-side ground pads 187, 188 in a package. Therefore, by providing a varistor thin film 174 on the input side between the input terminal pad 185 and the output-side ground pads 187, 188 and on the output side between output terminal pads 189, 190 and the input-side ground pad 186, the electrostatic destruction can be prevented in all the interdigital electrodes.

Figure 6:
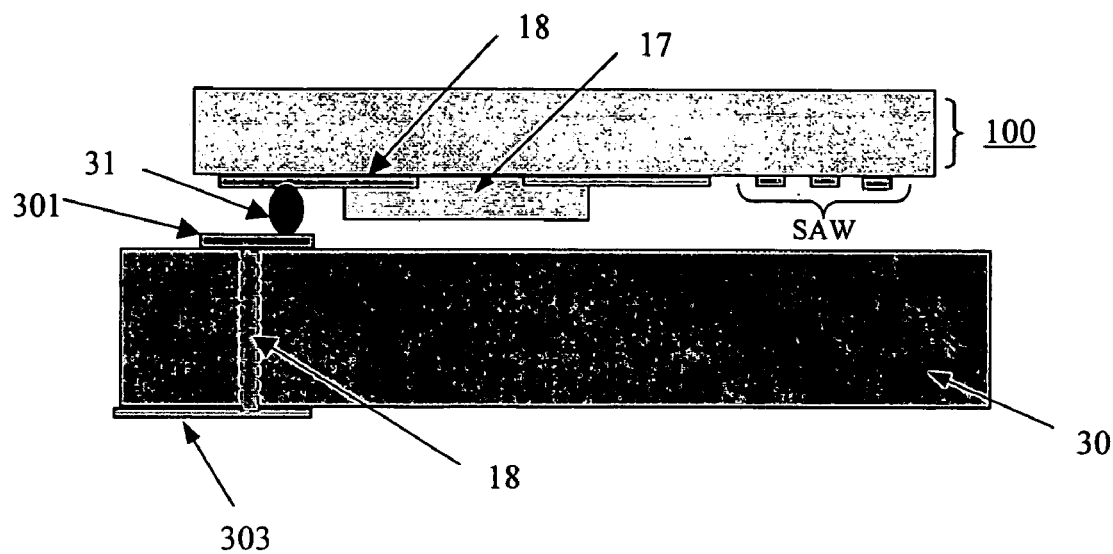
FIG. 6 is a diagram showing an example of an implementation of a surface acoustic wave apparatus to which the present invention is applied.

FIG. 6 is a diagram showing an example of an implementation of a surface acoustic wave apparatus to which the present invention is applied. This is an example applying the flip chip implementation technology is applied to the surface acoustic wave apparatus structure according to the present invention in the implementation. This implementation technology is an implementation method which flips the surface acoustic wave element chip 100 previously shown in FIG. 1 and FIG. 3 vertically and which connects the terminal pad 18 on the surface of the chip 100 with a conductive pattern 301 on a package base 30 using a bump 31 of a gold or solder ball without a bonding wire. Then, by covering with a cap or coating with resins, a small and thin surface acoustic wave filter is achieved.

The height of the bump 31 of the gold and solder ball can maintain the gap between the surface of the surface acoustic wave chip 100 and the surface of the package base 30 on the order of 10 to 50 µm. Since the varistor thin film 17 formed on the surface acoustic wave chip surface is approximately 1 to 10 µm, the varistor thin film 17 does not contact with the surface of the package base 30.

In FIG. 6, the conductive pattern 301 of the package base is connected to an external terminal 303 through a throughhole 302.

Figure 7:
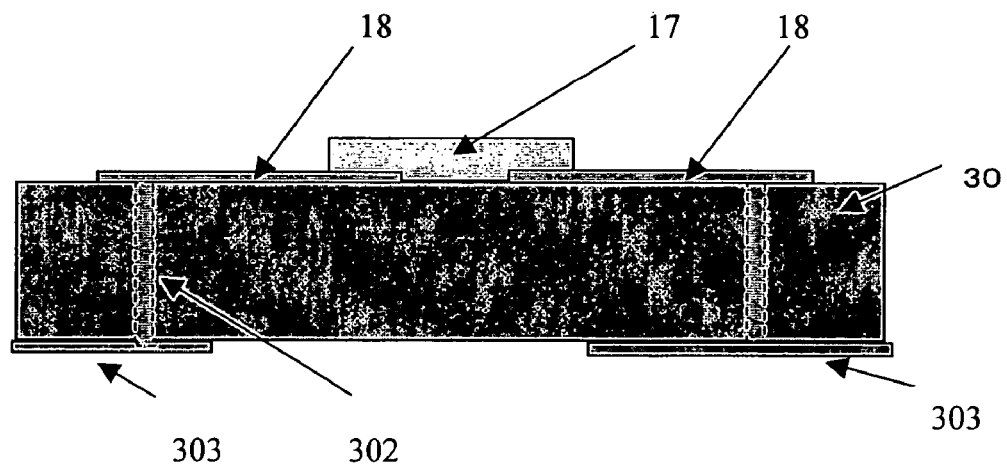
FIG. 7 shows an embodiment which forms a varistor thin film on a surface of a package base.

FIG. 7 is an embodiment, which forms the varistor thin film 17 on the surface of the package base 30. In the embodiment shown in FIG. 1, after forming the conductive pattern of the surface acoustic wave electrode pattern on the piezoelectric substrate 1 with the photolithography technology or the like, when the varistor thin film 17 is formed on the substrate surface, by disposing the piezoelectric substrate 1 to high temperatures, the fine electrode pattern may be damaged, or the electrode may be destroyed by the pyroelectricity of the substrate.

Therefore, in this embodiment, the varistor thin film 17 is formed on the package 30 side instead of the surface acoustic wave chip surface. In general, low-temperature co-fired ceramics (LTCC) or high-temperature co-fired ceramics (HTCC) are used as the material of the package base 30 of the surface acoustic wave element. Recently, other than above materials, silicon single crystals, glasses and sapphires are developed. Since each of these materials has excellent heat resistance, the degree of freedom is increased in setting up a temperature rising or temperature profile when the varistor thin film 17 is formed.

Therefore, the varistor thin films can be formed which are excellent in terms of management of a crystal grain diameter and film quality and which has less variation in the varistor characteristics.

Also, if the package base 30 is ceramics, a green sheet for the varistor thin film can be stacked with a green sheet for the firing of the package base to perform the firing at the same time. Other than forming on the surface of the package base, the varistor thin film may be embedded within the backside of the package base or the intermediate layer of the package base.

Subsequently, as shown in FIG. 6, connection is made to the surface acoustic wave chip 10 forming only the surface acoustic wave element via the bump 31.

Although the above embodiments are mainly described with an example of the surface acoustic wave apparatus using the surface acoustic wave resonator, the application of the present invention is not limited to this and the present invention can be applied to an elastic wave apparatus using a film bulk acoustic resonator (FBAR).

Figure 8:
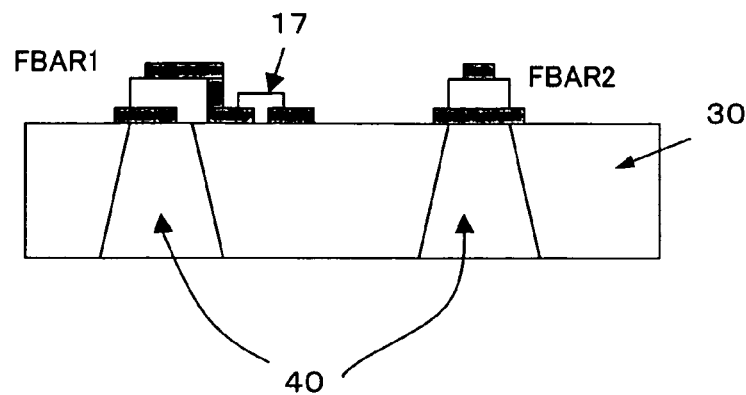
FIG. 8 shows an embodiment applying the present invention to an elastic wave apparatus using a film bulk acoustic resonator (FBAR)

FIG. 8 is an embodiment applying the present invention to an elastic wave apparatus using a film bulk acoustic resonator (FBAR). The film bulk acoustic resonator (FBAR) is an element exhibiting a resonator property with elastic waves propagated within a thin film rather than surface waves.

In FIG. 8, the package base 30 has cavity regions 40 excavated by anisotropic etching at positions where the film bulk acoustic resonators (FBAR) are disposed. Also, the film bulk acoustic resonators FBAR1, FBAR2 are mounted on the upper side of the positions of the cavity regions 40 in the package base 30. When high voltages are applied to the film bulk acoustic resonators due to accumulated charges, the discharge breakdown may occur. Therefore, as is the case with the embodiments previously described, the varistor thin film 17 is formed on the package base 30 and connected between a hot electrode and a ground electrode of the necessary film bulk acoustic resonators FBAR1, FBAR2.

In this way, the discharge breakdown can be avoided in the film bulk acoustic resonators FBAR1, FBAR2.

Now, it is necessary to increase a varistor voltage in order to adjust a discharge destroy voltage, if necessary. In this case, it is possible to increase the varistor voltage by stacking varistor thin films via conductive films as a multilayer to connect the varistor thin films in series. But, this may make the production costs high.

Figure 9A:
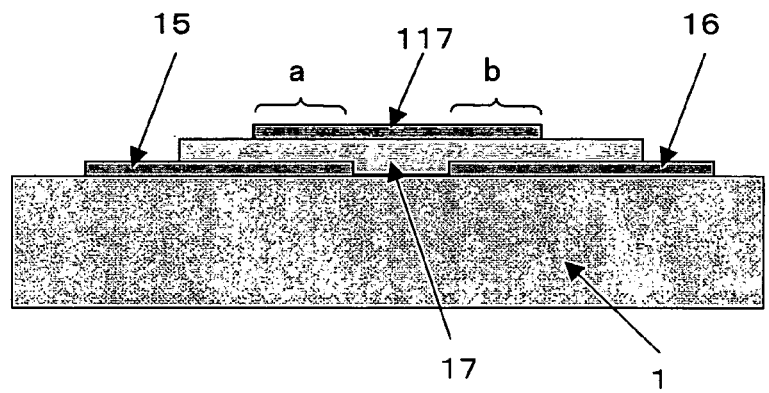
FIG. 9A shows a first example of a configuration, which increases the varistor voltage without configuring the varistor thin film as a stacked layer.
Figure 9B:
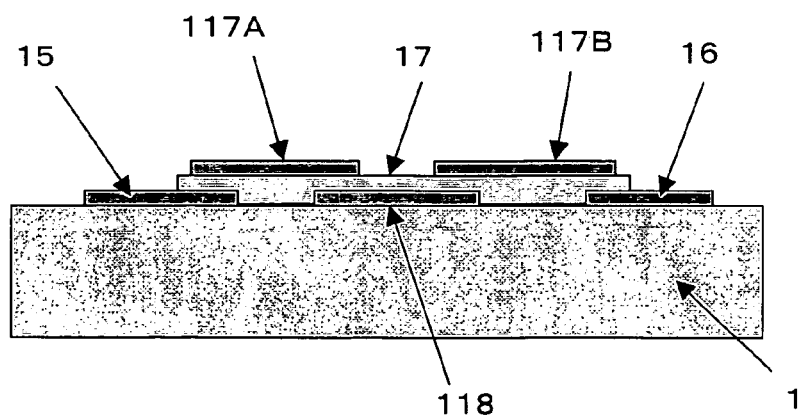
FIG. 9B shows a second example of a configuration, which increases the varistor voltage without configuring the varistor thin film as a stacked layer.

Accordingly, FIGS. 9a, 9B indicate schematic diagrams of an embodiment which increases the varistor voltage without stacking the varistor thin film as a multilayer. FIG. 9A shows an embodiment, in which the varistor voltage of the varistor thin film 17 is increased in FIG. 1, and indicates a sectional view along the line A–B.

The Varistor thin film 17 is connected to the varistor terminal patterns 15, 16, which are electrically connected between electrode fingers of the interdigital electrodes, on one side. On the other side opposite to the one side, the electric pattern 117 is formed, at least a part of which is facing to the varistor terminal patterns 15, 16.

At this time, an electric field applied on the varistor thin film 17 due to static electricity become to be connected in series between the portion "a" at which the varistor terminal pattern 15 faces to the electric pattern 117 and the portion "b" at which the varistor terminal pattern 16 faces to the electric pattern 117. Thereby, the varistor voltage can be increased without stacking the varistor thin film and the conductive film as a multilayer.

Also, if the varistor voltage is more increased by increasing the number of serial stages, the electric pattern 117 is divided into electrodes 117A, 117B, and the electric pattern 118 is formed having portions, which face to the electrodes 117A, 117B.

As described above, with the present invention, when static electricity with a voltage higher than the varistor voltage is applied, the resistance between the hot terminal and the ground terminal becomes low to pass the static charge to ground to enable the interdigital electrodes or the film bulk acoustic resonators of the surface acoustic wave element to be protected.

Also, since the thin film showing the varistor characteristics is integrally formed on the piezoelectric substrate onto which the surface acoustic wave element is formed and, therefore, destruction due to electrostatic discharges can be prevented at the time of a process for incorporating the relevant element into a mobile device or others. Therefore, it is expected that the reliability and production efficiency of cellular phones and others are improved.

While illustrative and presently preferred embodiments of the present invention have been described in detail herein, it is to be understood that the inventive concepts may be otherwise variously embodied and employed and that the appended claims are intended to be construed to include such variations except insofar as limited by the prior art.

What is claimed is:

1. A surface acoustic wave apparatus comprising:
   a piezoelectric substrate;
   a surface acoustic wave element having at least one interdigital electrode made up of a conductive film on the piezoelectric substrate; and
   a thin film electrically connected between terminals connecting to electrode fingers of the interdigital electrode, the thin film showing varistor characteristics formed on the piezoelectric substrate.

2. The surface acoustic wave apparatus according to claim 1, wherein the thin film showing the varistor characteristics is formed in the region on the piezoelectric substrate except portions where the interdigital electrode is formed and portions where surface acoustic waves propagate.

3. The surface acoustic wave apparatus according to claim 2, wherein the thin film showing the varistor characteristics has a film thickness of 1 μm to 100 μm.

4. The surface acoustic wave apparatus according to claim 2, wherein the thin film showing the varistor characteristics is made up of semiconductor ceramics such as a zinc oxide or a strontium titanate to which a minute amount of an addition agent is added and which has a crystal grain diameter of 1 μm to 50 μm.

5. The surface acoustic wave apparatus according to claim 2, wherein the thin film showing the varistor characteristics is formed at a room temperature by the aerosol deposition method which accelerates and causes micro powders of the material showing the varistor characteristics to collide against a substrate placed in reduced-pressure atmosphere.

6. The surface acoustic wave apparatus according to claim 1, wherein the thin film showing the varistor characteristics has a film thickness of 1 μm to 100 μm.

7. The surface acoustic wave apparatus according to claim 1, wherein the thin film showing the varistor characteristics is formed at a room temperature by the aerosol deposition method which accelerates and causes micro powders of the material showing the varistor characteristics to collide against a substrate placed in reduced-pressure atmosphere.

8. The surface acoustic wave apparatus according to claim 1, wherein the thin film showing the varistor characteristics is made up of semiconductor ceramics such as a zinc oxide or a strontium titanate to which a minute amount of an addition agent is added and which has a crystal grain diameter of 1 µm to 50 µm.

9. The A surface acoustic wave apparatus according to claim 1, wherein the thin film showing varistor characteristics is electrically connected on one side between the terminals connecting to electrode fingers of the interdigital electrode, and on the other side opposite to the one side, an electric pattern is formed, at least a part of which is facing to the terminals.

10. A elastic acoustic wave apparatus comprising:
a substrate having a cavity region excavated by anisotropic etching in the direction of thickness;
a film bulk acoustic resonator disposed at a position corresponding to the cavity region of the substrate;
a thin film showing varistor characteristics formed on the substrate, the thin film electrically connected between terminals of the film bulk acoustic resonator.

11. A surface acoustic wave apparatus comprising:
a surface acoustic wave chip wherein a surface acoustic wave element having at least one interdigital electrode made up of a conductive film is formed on a piezoelectric substrate; and
a package base substrate having a terminal electrode connected via a bump to a terminal electrode of the surface acoustic wave chip formed on the piezoelectric substrate, wherein
on the package base substrate, a thin film showing the varistor characteristics is formed, which is electrically connected between electrode fingers of the interdigital electrode.

12. The surface acoustic wave apparatus according to claim 11, wherein the thin film showing the varistor characteristics is formed on a top surface or an under surface of the package base substrate or within the substrate.

13. The A surface acoustic wave apparatus according to claim 11, wherein the thin film showing varistor characteristics is electrically connected on one side between the terminals connecting to electrode fingers of the interdigital electrode, and on the other side opposite to the one side, an electric pattern is formed, at least a part of which is facing to the terminals.

* * * * *